United States Patent
Jang et al.

(10) Patent No.: US 9,556,520 B2
(45) Date of Patent: Jan. 31, 2017

(54) METHOD OF DEPOSITING AN ATOMIC LAYER

(71) Applicant: Samsung Display Co., Ltd., Yongin (KR)

(72) Inventors: Choel-Min Jang, Seoul (KR); Sung-Hun Key, Seoul (KR); In-Kyo Kim, Seoul (KR); Suk-Won Jung, Seoul (KR); Myung-Soo Huh, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 174 days.

(21) Appl. No.: 14/296,029

(22) Filed: Jun. 4, 2014

(65) Prior Publication Data
US 2015/0050421 A1 Feb. 19, 2015

(30) Foreign Application Priority Data
Aug. 14, 2013 (KR) .................. 10-2013-0096328

(51) Int. Cl.
C23C 16/455 (2006.01)
C23C 16/458 (2006.01)

(52) U.S. Cl.
CPC ....... *C23C 16/45574* (2013.01); *C23C 16/458* (2013.01); *C23C 16/45551* (2013.01)

(58) Field of Classification Search
CPC .................. C23C 16/45523; C23C 16/45525; C23C 16/45548; C23C 16/45551
See application file for complete search history.

(56) References Cited

U.S. PATENT DOCUMENTS

2004/0082171 A1* 4/2004 Shin ............... C23C 16/452
 438/689
2006/0073276 A1* 4/2006 Antonissen ....... C23C 16/4412
 427/248.1

(Continued)

FOREIGN PATENT DOCUMENTS

| KR | 1020080049508 | 6/2008 |
| KR | 1020120034031 | 4/2012 |
| KR | 1020130007192 | 1/2013 |

OTHER PUBLICATIONS

Mundra, Paul, et al., "Automated setup for spray assisted layer-by-layer deposition". Review of Scientific Instruments 84, 074101 (2013), pp. 1-5.*

(Continued)

*Primary Examiner* — Bret Chen
(74) *Attorney, Agent, or Firm* — H.C. Park & Associates, PLC

(57) ABSTRACT

A method of depositing a layer includes spraying a source gas and a reactant gas onto a substrate disposed on a susceptor unit using at least one source gas spray nozzle and at least one reactant gas nozzle to form a first source gas region and a first reactant gas region on the substrate, respectively, moving the susceptor unit by a distance corresponding to a width of the source gas spray nozzle or a width of the reactant gas spray nozzle in a first direction, and spraying the source gas and the reactant gas onto the first reactant gas region and the first source gas region using the source gas spray nozzle and the reactant gas nozzle, respectively, to form a first monolayer.

9 Claims, 6 Drawing Sheets

(56) References Cited

U.S. PATENT DOCUMENTS

| | | | |
|---|---|---|---|
| 2007/0095286 A1* | 5/2007 | Baek | C23C 16/4412 |
| | | | 118/719 |
| 2008/0127892 A1 | 6/2008 | Kim | |
| 2009/0078204 A1 | 3/2009 | Kerr et al. | |
| 2009/0165715 A1 | 7/2009 | Oh | |
| 2010/0037820 A1* | 2/2010 | Lee | C23C 16/45551 |
| | | | 118/719 |
| 2010/0124610 A1* | 5/2010 | Aikawa | C23C 16/4584 |
| | | | 427/255.28 |
| 2010/0186669 A1* | 7/2010 | Shin | C23C 16/45546 |
| | | | 118/719 |
| 2010/0240200 A1* | 9/2010 | Sakaue | H01L 21/67742 |
| | | | 438/514 |
| 2011/0120542 A1 | 5/2011 | Levy | |
| 2012/0118233 A1 | 5/2012 | Werkhoven | |
| 2013/0005057 A1 | 1/2013 | Kim et al. | |
| 2013/0118407 A1* | 5/2013 | Park | C23C 16/45551 |
| | | | 118/725 |

OTHER PUBLICATIONS

Wu, Yanlin, et al., "Atomic Layer Deposition from Dissolved Precursors". NanoLetters 2015, 15, 6379-6385.*

Maydannik, P.S., et al., "An atomic layer deposition process for moving flexible substrates". Chemical Engineering Journal 171 (2011) 345-349.*

* cited by examiner

METHOD OF DEPOSITING AN ATOMIC LAYER

CROSS REFERENCE TO RELATED APPLICATION

This application claims priority from and the benefit of Korean Patent Application No. 10-2013-0096328 filed on Aug. 14, 2013, which is hereby incorporated by reference for all purposes as if fully set forth herein.

BACKGROUND

Field

Exemplary embodiments of the present invention relate to semiconductor manufacturing methods and apparatuses. More particularly, exemplary embodiments of the inventive concept relate to methods of depositing atomic layers and atomic layer deposition apparatuses.

Discussion of the Background

An atomic layer deposition (ALD) method is a surface controlled process which results in two-dimensional layer-by-layer deposition. The ALD method is conducted in a surface kinetic regime, thereby ensuring excellent step coverage. In ALD method, source gas and reactant gas are applied periodically, chemical exchange takes place, and a thin film is formed with very high density. Moreover, since by-products generated in the ALD method are always gas, it is easy to remove the by-products using an exhaust nozzle.

Generally, in the ALD method, the substrate should be moved in and out of a gas sprayed region onto which gas is sprayed by a gas spray unit. To maintain the uniformity of the thin film, the gas spray unit should maintain a fixed distance from the gas sprayed region. The fixed distance between the gas spray unit and the gas sprayed region is maintained by the substrate when the substrate is within the gas sprayed region. When the substrate is moved out of the gas sprayed region, however, extra plates (i.e., buffer plates) may be arranged at both sides of the substrate to maintain the fixed distance. Further, each buffer plate should have a length corresponding to a length of the substrate, or an entire length of the gas spray unit.

As the size of the display panel increases, the length of each buffer plate increases correspondingly, thus increasing the size of the atomic layer deposition apparatus. As the size of the atomic layer deposition apparatus increases, a tact time of the ALD method is increased, a usage of gas is increased, and the uniformity of the thin film is decreased.

The above information disclosed in this Background section is only for enhancement of understanding of the background of the invention and therefore it may contain information that does not form any part of the prior art nor what the prior art may suggest to a person of ordinary skill in the art.

SUMMARY

Exemplary embodiments of the present invention provide a method of depositing an atomic layer to a substrate of a semiconductor device by using an atomic layer deposition apparatus.

Exemplary embodiments of the present invention provide an atomic layer deposition apparatus to minimize the size of the apparatus.

Additional features of the invention will be set forth in the description which follows, and in part will be apparent from the description, or may be learned by practice of the invention.

An exemplary embodiment of the present invention discloses a method of depositing a layer, including spraying a source gas and a reactant gas onto a substrate disposed on a susceptor unit using at least one source gas spray nozzle and at least one reactant gas nozzle to form a first source gas region and a first reactant gas region on the substrate, respectively, the at least one source gas spray nozzle and the at least one reactant gas spray nozzle being alternately arranged in a gas spray unit, moving the susceptor unit by a distance corresponding to a width of the at least one source gas spray nozzle or a width of the at least one reactant gas spray nozzle in a first direction so that the at least one reactant gas spray nozzle is disposed over the first source gas region and the at least one source gas spray nozzle is disposed over the first reactant gas region, and spraying the source gas and the reactant gas onto the first reactant gas region and the first source gas region using the at least one source gas spray nozzle and the at least one reactant gas nozzle, respectively, to form a first monolayer.

An exemplary embodiment of the present invention discloses a layer deposition apparatus, including a gas spray unit including at least one source gas spray nozzle configured to spray source gas onto a substrate and at least one reactant gas spray nozzle configured to spray reactant gas onto the substrate, and a susceptor unit configured to receive the substrate, the susceptor unit configured to face the gas spray unit, and comprising buffer plates configured to hold the substrate, wherein a length of each buffer plate corresponds to a width of the source gas spray nozzle or a width of the reactant gas spray nozzle, and the susceptor unit is configured to move by a distance corresponding to the length of each buffer plate in a first direction or a second direction, which is opposite to the first direction.

An exemplary embodiment of the present invention also discloses a method of depositing a layer, the method comprising, spraying a source gas onto a substrate disposed on a susceptor unit using at least one source gas spray nozzle to form a first source gas region on the substrate from a gas spray unit, the at least one source gas spray nozzle and at least one reactant gas spray nozzle being alternately arranged in a gas spray unit, moving the susceptor unit by a distance corresponding to a width of the at least one source gas spray nozzle or a width of the at least one reactant gas spray nozzle in a first direction so that the at least one reactant gas spray nozzle is disposed over the first source gas region and the at least, one source gas spray nozzle is disposed over a region where the substrate is exposed, spraying the source gas onto the region where the substrate is exposed, using the at least one source gas spray nozzle to form a second source gas region on the substrate, spraying a reactant gas onto the first source gas region to form first monolayer region, moving the susceptor unit by a distance corresponding to a width of the at least one source gas spray nozzle or a width of the at least one reactant gas spray nozzle in a second direction, which is opposite to the first direction, so that the at least one reactant gas spray nozzle is disposed over the second source gas region and the at least one source gas spray is nozzle is disposed over the first monolayer region; and spraying the reactant gas onto the second source gas region using the reactant gas nozzle to form a first monolayer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1A:
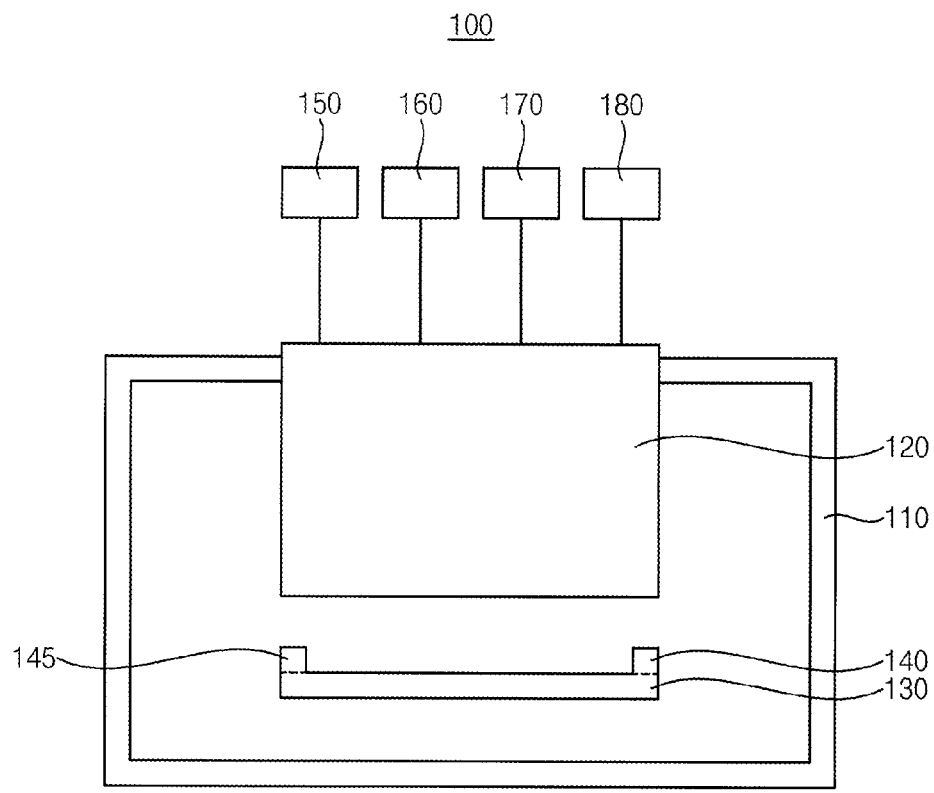
FIG. 1A is a diagram illustrating an atomic layer deposition apparatus according to exemplary embodiments.

The exemplary embodiments are described more fully hereinafter with reference to the accompanying drawings. The inventive concept may, however, be embodied in many different forms and should not be construed as limited to the exemplary embodiments set forth herein. Rather, these embodiments are provided so that this disclosure is thorough, and will fully convey the scope of the invention to those skilled in the art. In the drawings, the sizes and relative sizes of layers and regions may be exaggerated for clarity. Like reference numerals in the drawings denote like elements.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or is section from another region, layer, pattern or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross sectional illustrations that are schematic illustrations of illustratively idealized exemplary embodiments is (and intermediate structures) of the inventive concept. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1A is a diagram illustrating an atomic layer deposition apparatus according to exemplary embodiments.

Referring to FIG. 1A, an atomic layer deposition apparatus 100 may include a process chamber 110, a gas spray unit 120, a susceptor unit 130, buffer plates 140, 145, a source gas storage tank 150, a reactant gas storage tank 160, a purge gas storage tank 170, and an exhaust pumping unit 180. The gas spray unit 120 may include at least one source gas spray nozzle, at least one reactant gas spray nozzle, at least one purge gas spray nozzle, and at least one exhaust nozzle.

The process chamber 110 may provide a space for an atomic layer deposition (ALD) process to be performed. The size of the process chamber 110 may depend on the size of is a substrate or a reciprocating distance of the susceptor unit 130 that includes buffer plates 140 and 145.

The gas spray unit 120 in the process chamber 110 may spray gas onto the substrate. The gas spray unit 120 may be arranged over the susceptor unit 130 at a fixed distance therebetween. Here, the gas sprayed onto the substrate may form a thin film. The gas may include at least source gas and reactant gas that form the thin film, and may further include purge gas that removes remaining source gas and reactant gas.

The gas spray unit 120 may include at least one source gas spray nozzle that sprays source gas onto the substrate, at least one reactant gas spray nozzle that sprays reactant gas onto the substrate, and at least one purge gas spray nozzle that sprays purge gas onto the substrate. In exemplary embodiments, the source gas spray nozzle may include a plurality of source gas spray nozzles, the reactant gas spray nozzle may include a plurality of reactant gas spray nozzles, and the source gas spray nozzles and the reactant gas spray nozzles may be alternately arranged along a first direction in the gas spray unit 120. The first direction may be a moving direction of the susceptor unit 130 during the deposition process. Thus, the source gas and the reactant gas may be alternately deposited. The source gas spray nozzle may spray the source gas onto a region of the substrate to form a first source gas region, and the reactant gas spray nozzle may spray the reactant gas onto another region of the substrate to form a first reactant gas region. The width of the first source gas region corresponds to the width of the source gas spray nozzle, and the width of the first reactant gas region may correspond to the width of the reactant gas spray nozzle. The source gas spray nozzle and the reactant gas spray nozzle may have the same width, and thus the width of the first source gas region and the first reactant gas region may be same. For example, the source gas may include trimethyl-aluminum (TMA), and the reactant gas may include oxygen ($O_2$) or ozone ($O_3$), and the atomic layer deposition apparatus 100 may be used to deposit a gate dielectric layer including aluminum oxide ($Al_2O_3$) on the substrate of the display panel. However, the source gas and the reactant gas are not limited thereto. For example, the source gas may include a raw material of a dielectric layer including hafnium oxide ($HfO_2$), silica ($SiO_2$), zirconium dioxide ($ZrO_2$), and the like, a raw material of an organic layer, etc.

In exemplary embodiments, two purge gas spray nozzles may be arranged at both sides of the gas spray unit, respectively. In exemplary embodiments, the purge gas spray nozzle may be arranged between the source gas spray nozzle and the reactant gas spray nozzle. In exemplary embodiments, the purge gas spray nozzles may be arranged at both sides of the gas spray unit, and between the source gas spray nozzle and the reactant gas spray nozzle. The purge gas may include non-active gas such as argon gas (Ar), nitrogen gas ($N_2$), helium gas (He), and the like. The purge gas may remove remaining source gas and reactant gas.

The susceptor unit 130 may be arranged in the process chamber 110 facing the gas spray unit 120. The susceptor unit 130 may move in the first direction and a second direction, which is opposite to the first direction. A moving distance (or a reciprocating distance) of the susceptor unit 130 may correspond to the width of the source gas spray nozzle and the width of the reactant gas spray nozzle. A substrate may be arranged on the surface of the susceptor unit 130. By the reciprocating motion of the susceptor unit 130, the source gas and reactant gas are alternately applied to the surface of the substrate forming deposition of a reaction product (e.g., aluminum oxide) from the reaction of the source gas and the reactant gas. Thus, a thin film (or a monolayer) having predetermined thickness may be formed on the substrate.

In an exemplary embodiment of the present invention, the susceptor unit 130 may be in fixed position and the gas spray unit 120 may move in the first direction and the second direction. Also, both the gas spray unit 120 and the susceptor unit 130 may move in the first direction and the second direction.

In exemplary embodiments, the gas spray unit 120 may further include a source gas supply line coupled to the source gas spray nozzle, a reactant gas supply line coupled to the reactant gas spray nozzle, and a purge gas supply line coupled to the purge gas spray nozzle. Further, the source gas supply line may be coupled to a source gas storage tank 150, the reactant gas supply line may be coupled to a reactant gas storage tank 160, and the purge gas supply line may be coupled to a purge gas storage tank 170. The gas storage tanks 150, 160, and 170 may store the aforementioned gas, respectively. The source gas spray units may receive the source gas through the source gas supply line from the source gas storage tank 150, and spray the source gas onto the substrate arranged on the susceptor unit 130. The reactant gas and the purge gas may be sprayed onto the substrate in similar ways.

In exemplary embodiments, the gas spray unit 120 may further include an exhaust nozzle arranged between the source gas spray nozzle and the reactant gas spray nozzle. The exhaust nozzle may be coupled to the exhaust pumping unit 180 through an exhaust line, and maintain a vacuum state within the process chamber 110. The exhaust nozzle may discharge remaining source gas, reactant gas, and purge gas out of the process chamber 110.

The buffer plates 140 and 145 may be arranged on the susceptor unit 130. A length of each buffer plate may correspond to the width of the source gas spray nozzle and the width of the reactant gas spray nozzle. In exemplary embodiments, two buffer plates 140 and 145 may be arranged at both sides of the substrate to hold the substrate on the susceptor unit. The buffer plates 140 and 145 may be configured to hold or fix the substrate. To maintain the uniformity of the thin film, the gas spray unit 120 should maintain a fixed distance from the region which the gas spray unit 120 sprays gas onto. The fixed distance between the gas spray unit 120 and the gas sprayed region may be maintained by the substrate when the substrate is at the gas sprayed region. The buffer plates 140 and 145 in the exemplary embodiments, arranged at both sides of the substrate facing the gas spray unit 120, may maintain the fixed distance when the substrate is moved out of the gas sprayed region. The buffer plates 140 and 145 may prevent a bottom of the process chamber 110 from being exposed to the source gas and the reactant gas, and the atomic layer deposition apparatus 100 (or the process chamber 110) from being polluted. The buffer plaits 140 and 145 may further aid uniform deposition of the thin film on the substrate by preventing pressure condition change during the atomic layer deposition process.

The length of the buffer plates 140 and 145 may be minimized to the width of the source gas spray nozzle or the width of the reactant gas spray nozzle, by configuring the moving distance (or a reciprocating distance) of the susceptor unit 130 to correspond to the width of the source gas spray nozzle or the width of the reactant gas spray nozzle. Therefore, the present exemplary embodiment of atomic layer deposition apparatus 100 may have the moving distance (or a reciprocating distance) of the susceptor unit 130 less than ⅕ of that of a conventional atomic layer deposition apparatus. Thus, the volume of the process chamber 110 may be reduced, despite the increase in size of the substrate for the atomic layer deposition apparatus 100 to process, according to market demand for larger display panel. Minimizing the volume of the process chamber 110 may have following advantages: shorter tact time in thin film deposition process; reduced usage of the source gas, the reactant gas, and the purge gas; improved uniformity in the thin film layer formed on the substrate; and improved stability of the is atomic layer deposition apparatus from decreased moving distance of the susceptor unit.

Figure 1B:
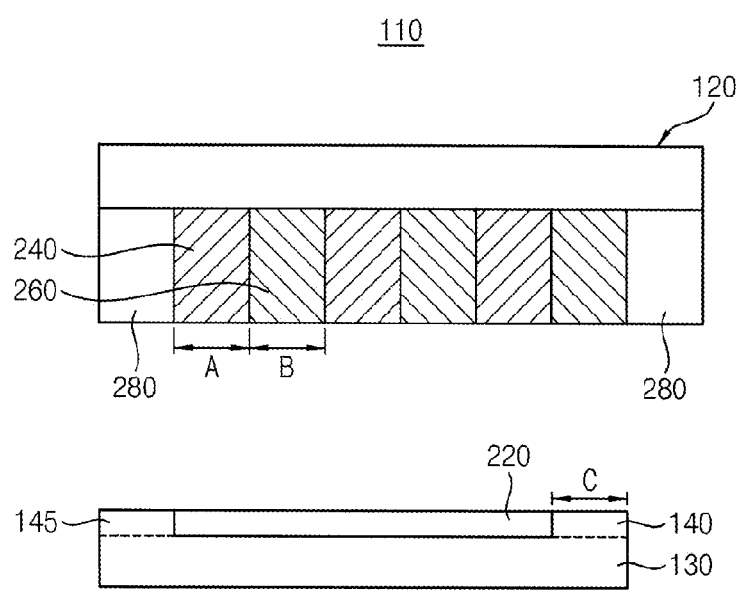
FIG. 1B is a cross-sectional view of an exemplary embodiment of a gas spray unit and a susceptor unit of the atomic layer deposition apparatus of FIG. 1A.

FIG. 1B is a cross-sectional view of an exemplary embodiment of a gas spray unit and a susceptor unit of the atomic layer deposition apparatus of FIG. 1A.

Referring to FIG. 1B, the atomic layer deposition apparatus 100 may include the gas spray unit 120 and the susceptor unit 130 in the process chamber 110.

The gas spray unit 120 may include at least one source gas spray nozzle 240 that sprays source gas onto a substrate 220, at least one reactant gas spray nozzle 260 that sprays reactant gas onto the substrate 220, and at least one purge gas spray nozzle 280 that sprays purge gas onto the substrate 220. The susceptor unit 130 may include the substrate 220 and two buffer plates 140 and 145. The buffer plates 140 and 145 may be arranged at both sides of the substrate 220, respectively.

In exemplary embodiments, the gas spraying unit 120 may include a plurality of source gas spray nozzles and a plurality of reactant gas spray nozzles. The source gas spray nozzles 240 and the reactant gas spray nozzles 260 may be alternately arranged along a first direction in the gas spray unit 120. The source gas spray nozzle 240 and the reactant gas spray nozzle 260 may spray the source gas and the reactant gas onto the substrate 220 to form a first source gas region and a first reactant gas region on the substrate 220, respectively.

The substrate 220 may include a glass substrate, a quartz substrate, a metallic oxide substrate, a plastic substrate, etc. A shape of the substrate 220 and a size of the substrate are not limited in the FIG. 1B. The substrate 220 may have various shapes and sizes such as a circle, square, etc. The substrate 220 may be arranged on the susceptor unit 130 for forming a thin film by an atomic layer deposition.

Two buffer plates 140 and 145 may be arranged on the susceptor unit 130 and a is length of each buffer plate 140 and 145 (i.e., indicated by reference letter C) may correspond to the width of the source gas spray nozzle 240 (i.e., indicated by reference letter A) or the width of the reactant gas spray nozzle 260 (i.e., indicated by reference letter B). The width A of the source gas spray nozzle 240 may be the same as the width B of the reactant gas spray nozzle 260. Further, the buffer plates 140 and 145 may be arranged at both sides of the substrate 220 to hold the substrate 220. In other words, the substrate 220 may be arranged on the susceptor unit 130 between the buffer plates 140 and 145.

Figure 2:
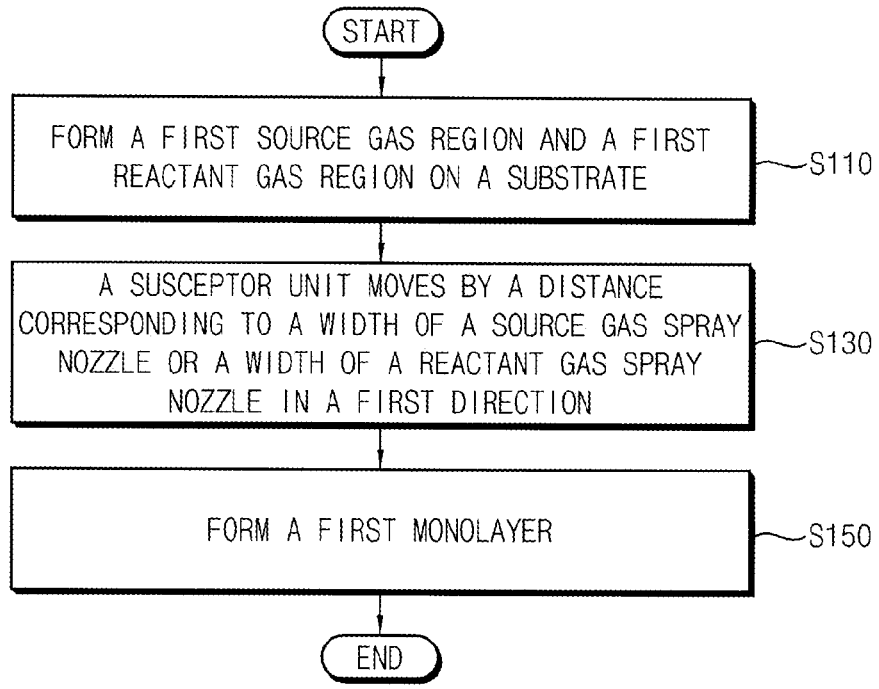
FIG. 2 is a flow chart illustrating a method of depositing an atomic layer according to exemplary embodiments.

FIG. 2 is a flow chart illustrating a method of depositing an atomic layer according to exemplary embodiments.

Referring to FIG. 2, the method of depositing an atomic layer may include following steps: spraying source gas and reactant gas onto the substrate disposed on the susceptor unit using at least one source gas spray nozzle and at least one reactant gas nozzle to form a first source gas region and a first reactant gas region on the substrate, respectively (Step S110). The source gas spray nozzle and the reactant gas spray nozzle are alternately arranged in a gas spray unit. The susceptor unit may be moved by a distance corresponding to a width of the source gas spray nozzle or a width of the reactant gas spray nozzle in a first direction so that the reactant gas spray nozzle is disposed over the first source gas region and the source gas spray nozzle is disposed over the first reactant gas region (Step S130). The source gas and the reactant gas may then be sprayed onto the first reactant gas region and the first source gas region, respectively, to form a first monolayer (Step S150). A single cycle of the process may form one monolayer, and thus, the thin film having desired thickness may be formed by repeating the cycles, depositing an atomic layer every cycle.

In exemplary embodiments, the method of depositing the atomic layer may include following steps: spraying the source gas onto the substrate disposed on the susceptor unit using at least one source gas spray nozzle to form a first source gas region on the substrate from the gas spray unit, the at least one source gas spray nozzle and at least one reactant gas spray nozzle being alternately arranged in the gas spray unit. The susceptor unit may be moved by the distance corresponding to the width of the at least one source gas spray nozzle or the width of the at least one reactant gas spray nozzle in the first direction so that the at least one reactant gas spray nozzle is disposed over the first source gas region and the at least one source gas spray nozzle is disposed over a region where the substrate is exposed. The source gas may then sprayed onto the region where the substrate is exposed, by using the at least one source gas spray nozzle to form a second source gas region on the substrate. The reactant gas may be sprayed the first source gas region to form first monolayer region. The first monolayer region means portions of the first monolayer. The susceptor unit may be moved by the distance corresponding to the width of the at least one source gas spray nozzle or the width of the at least one reactant is gas spray nozzle in the second direction, which is opposite to the first direction, so that the at least one reactant gas spray nozzle is disposed over the second source gas region and the at least one source gas spray nozzle is disposed over the first monolayer region. The reactant gas may then be sprayed onto the second source gas region by using the reactant gas nozzle to form a first monolayer.

Figure 3A:
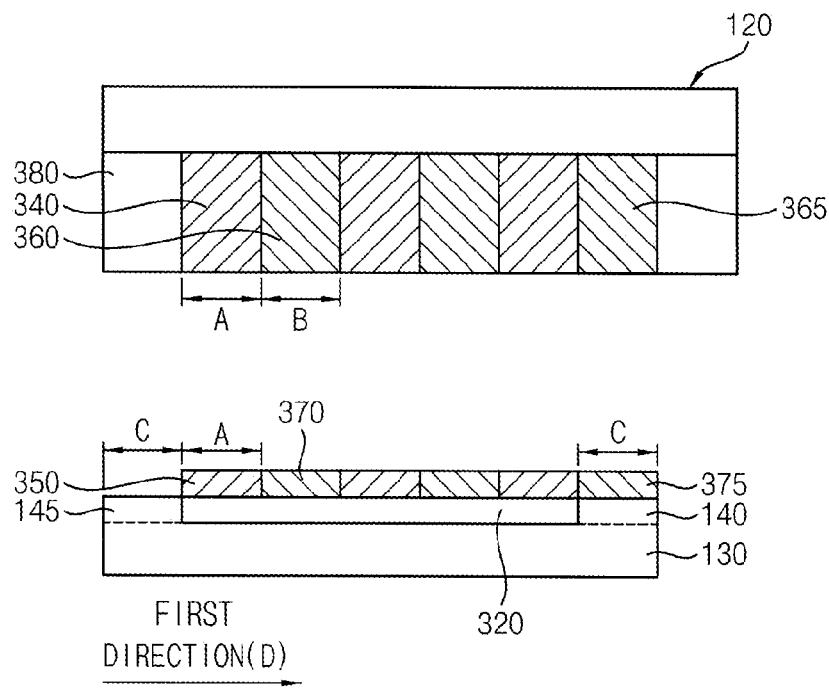
FIG. 3A and FIG. 3B are diagrams illustrating an exemplary embodiment of the method of depositing an atomic layer of FIG. 2.
Figure 3B:
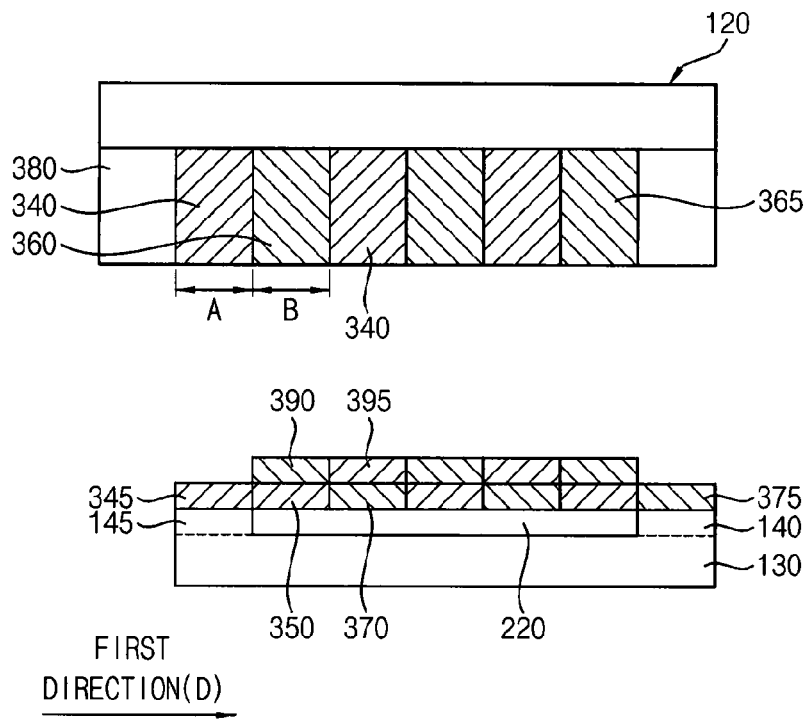

FIG. 3A and FIG. 3B are diagrams illustrating an exemplary embodiment of the method of depositing an atomic layer of FIG. 2.

Referring to FIG. 3A, at least one source gas spray nozzle 340 and at least one reactant gas spray nozzle 360 may spray the source gas and the reactant gas onto the substrate 320 to form a first source gas region 350 and a first reactant gas region 370 on the substrate 320, respectively (Step S110). In exemplary embodiments, the source gas spray nozzle 340 may include a plurality of source gas spray nozzles 340, and the reactant gas spray nozzle 360 may include a plurality of reactant gas spray nozzles 360 and 365. The source gas spray nozzles 340 and the reactant gas spray nozzles 360 and 365 may be alternately arranged along a first direction in a gas spray unit 120. According to step S110, at least one first source gas region 350 and at least one first reactant gas region 370 and 375 may be alternately formed on the substrate 320. Example of the source gas may include trimethyl-aluminum (TMA), and example of the reactant gas may include oxygen ($O_2$), ozone ($O_3$). Therefore, the atomic layer deposition apparatus 100 may be used to deposit a gate dielectric layer that is formed on the substrate of the display panel by aluminum oxide ($Al_2O_3$). However, the source gas and the reactant gas are not limited thereto. For example, the source gas may include a raw material of a dielectric layer including hafnium oxide ($HfO_2$), silica ($SiO_2$), zirconium dioxide ($ZrO_2$), and the like, a raw material of an organic layer, etc.

In exemplary embodiments, two buffer plates 140 and 145 may be arranged on the susceptor unit 130. A length of each buffer plate (C) may correspond to the width of the source gas spray nozzle (A) or the width of the reactant gas spray nozzle (B). As illustrate in FIG. 3A, the first reactant gas region 375 may be formed on the buffer plate 140 facing the reactant gas spray nozzle 365 by the reactant gas spray nozzle 365 spraying the reactant gas onto the buffer plate 140.

In exemplary embodiments, the purge gas spray nozzle 380 may spray the purge gas onto the substrate 320 so that the purge gas may remove remaining source gas and reactant gas. The purge gas may include non-active gas such as argon gas (Ar), nitrogen gas ($N_2$), helium gas (He), and the like.

Referring to FIG. 3B, the susceptor unit 130 may move by a distance corresponding to the width of the source gas spray nozzle (A) or the width of the reactant gas spray nozzle (B) in a first direction (i.e., indicated by D), and the reactant gas spray nozzle 360 is disposed over the first source gas region 350 and the source gas spray nozzle 340 is disposed over the first reactant gas region 370 (Step S130). The source gas and the reactant gas may be sprayed onto the first reactant gas region 370 and the first source gas region 350, from the source gas spray nozzle 340 and the reactant gas nozzle 360, respectively, to form the first monolayer (Step S150) while the susceptor unit 130 moves to the first direction (D).

As the substrate 320 is moved in the first direction with the susceptor unit 130, the buffer plate 145 may face the source gas spray nozzle 340. Thus, the source gas region 345 may be formed on the buffer plate 145.

The method of depositing an atomic layer in FIG. 3A and FIG. 3B may constitute one cycle of forming one monolayer. Thus, the thin film having desired thickness may be is formed by repeating the cycles.

FIG. 4A through FIG. 4D are diagrams illustrating an exemplary embodiment of the method of depositing an atomic layer of FIG. 2.

More specifically, the diagrams in FIG. 4A through FIG. 4D describe forming a plurality of the thin film layers by repeating the method of depositing the atomic layer of FIG. 2.

Figure 4A:
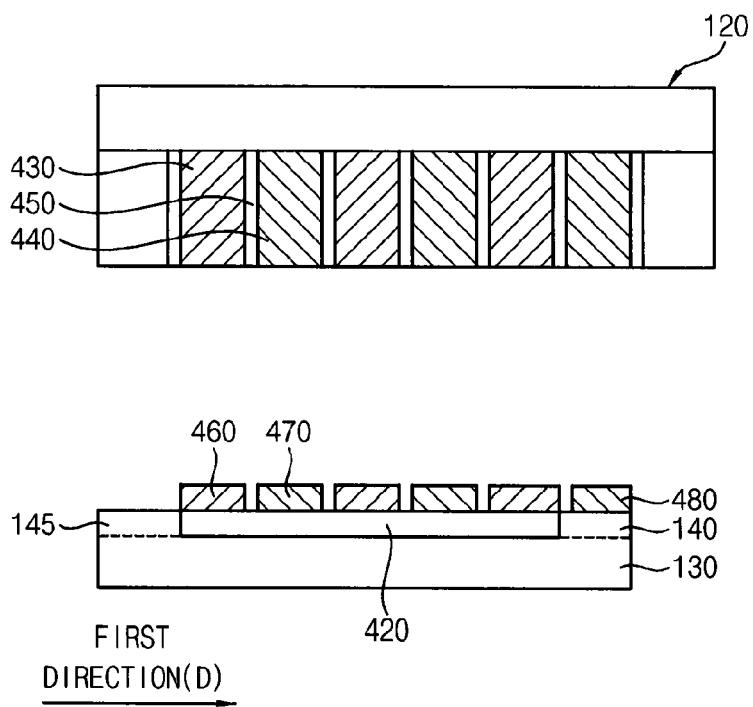
FIG. 4A through FIG. 4D are diagrams illustrating an exemplary embodiment of the method of depositing an atomic layer of FIG. 2.

Referring to FIG. 4A, at least one source gas spray nozzle 430 and at least one reactant gas spray nozzle 440 may spray the source gas and the reactant gas onto the substrate 420, and form at least one first source gas region 460 and at least one first reactant gas region 470 on the substrate 420, respectively. In exemplary embodiments, the source gas spray nozzle 430 may include a plurality of source gas spray nozzles, and the reactant gas spray nozzle 440 may include a plurality of reactant gas spray nozzles. The source gas spray nozzles 430 and the reactant gas spray nozzles 440 may be alternately arranged along a first direction (D) in a gas spray unit 120. Thus, the at least one first source gas region 460 and the at least one first reactant gas region 470 may be alternately formed on the substrate 420. Since these are described above, duplicated descriptions will not be repeated. In exemplary embodiments, at least one purge gas spray nozzle 450 may spray the purge gas onto the substrate 420 so that the purge gas may remove remaining source gas and reactant gas.

In exemplary embodiments, two purge gas spray nozzles may be arranged at both sides of the gas spray unit 120, respectively. In exemplary embodiments, the purge gas spray nozzle 450 may be arranged between the source gas spray nozzle 430 and the reactant gas spray nozzle 440. In exemplary embodiments, the purge gas spray nozzles may be arranged at both sides of the gas spray unit 120, and between the source gas spray nozzle 430 and the reactant gas spray nozzle 440. The purge gas may remove remaining source gas and reactant gas.

Figure 4B:
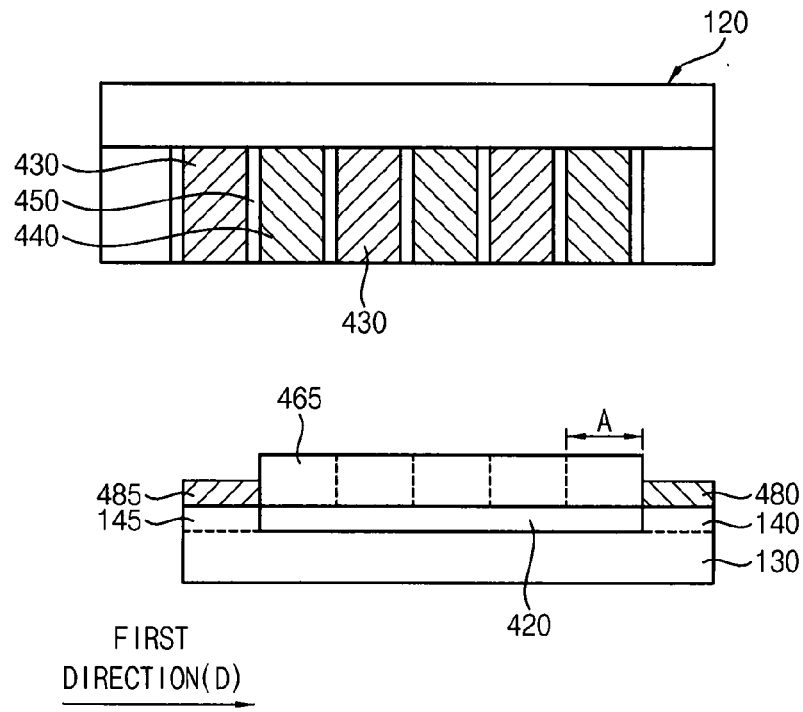

Referring to FIG. 4B, the susceptor unit 130 may move by a distance corresponding to the width of the source gas spray nozzle (A) or the width of the reactant gas spray nozzle (B) in a first direction (D), and the reactant gas spray nozzle 440 is disposed over the first source gas region 460 and the source gas spray nozzle 430 is disposed over the first reactant gas region 470. The source gas and the reactant gas may be sprayed onto the first reactant gas region 470 and the first source gas region 460, from the source gas spray nozzle 430 and the reactant gas nozzle 440, respectively, to form a first monolayer 465 while the susceptor unit 130 moves in the first direction (D). Here, the reactant gas may form the reactant gas region 480 on the buffer plate 140 and the source gas may form the source gas region 485 on the buffer plate 145.

Figure 4C:
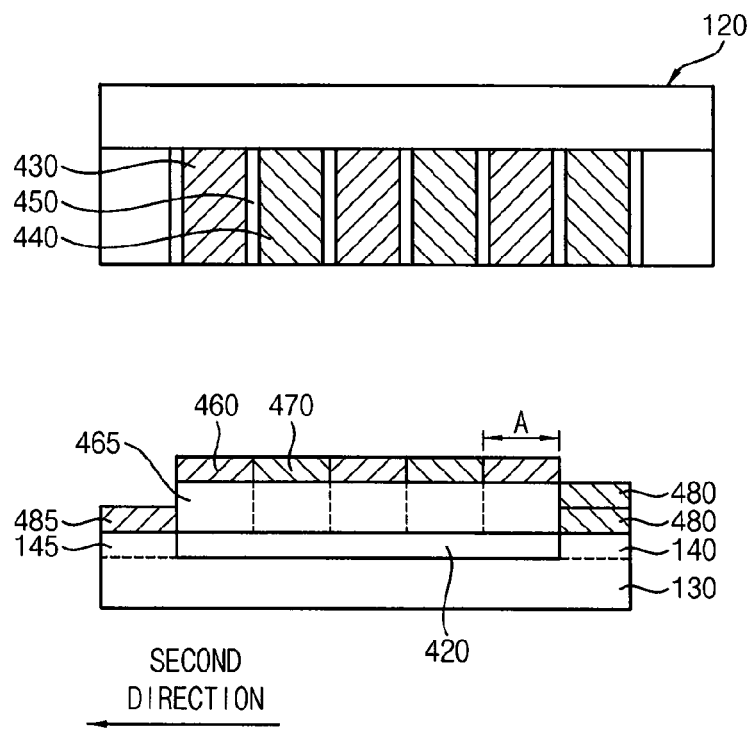

Referring to FIG. 4C, the source gas spray nozzle 430 and the reactant gas spray nozzle 440 may spray the source gas and the reactant gas, respectively, onto the first monolayer 465, and the susceptor unit 130 may move by the distance corresponding to the width of the source gas spray nozzle 430 (A) or the width of the reactant gas spray nozzle 440 in a second direction, which is opposite to the first direction (D). Thus, at least one second source gas region 460 and at least one second reactant gas region 470 may be formed on the first monolayer 465, respectively. Since these are described above, duplicated descriptions will not be repeated. At least one purge gas spray nozzle 450 may spray purge gas onto the substrate 420 for removing remaining source gas and reactant gas, while the source gas region, the reactant gas region, and the monolayer are formed.

Figure 4D:
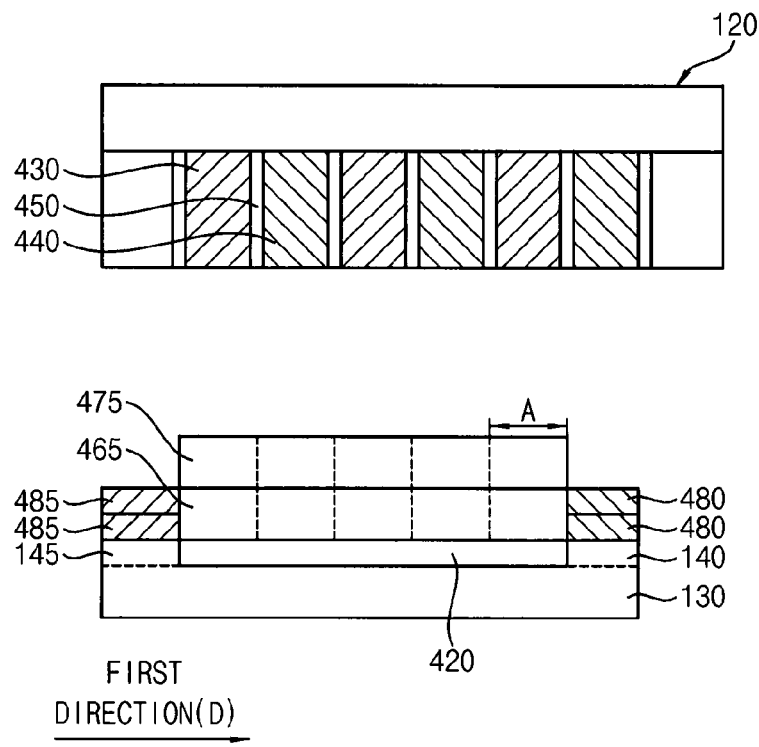

Referring to FIG. 4D, the susceptor unit 130 may move by the distance corresponding to the width of the source gas spray nozzle (A) or the width of the reactant gas spray nozzle in the first direction (D), and the reactant gas spray nozzle 440 is disposed over the is second source gas region 460 and the source gas spray nozzle 430 is disposed over the second reactant gas region 470. The source gas and the reactant gas may be sprayed onto the second reactant gas region 470 and the second source gas region 460, from the source gas spray nozzle 430 and the reactant gas nozzle 440, respectively, to form a second monolayer 475 on the first monolayer 465 while the susceptor unit 130 moves in the first direction (D). The second monolayer 475 may be formed by repeating process of forming the first monolayer 465. Since these are described above, duplicated descriptions will not be repeated. The purge gas may be consistently sprayed onto the substrate 420 for removing remaining source gas and reactant gas to improve the reproducibility of the process of the atomic layer deposition.

In exemplary embodiments, at least one monolayer may be further formed on the second monolayer 475 by reciprocating motion of the susceptor unit 130. The thickness of the thin film layer may be uniformly formed on the substrate 420 by repeating the reciprocating motion of the susceptor unit 130.

Figure 5A:
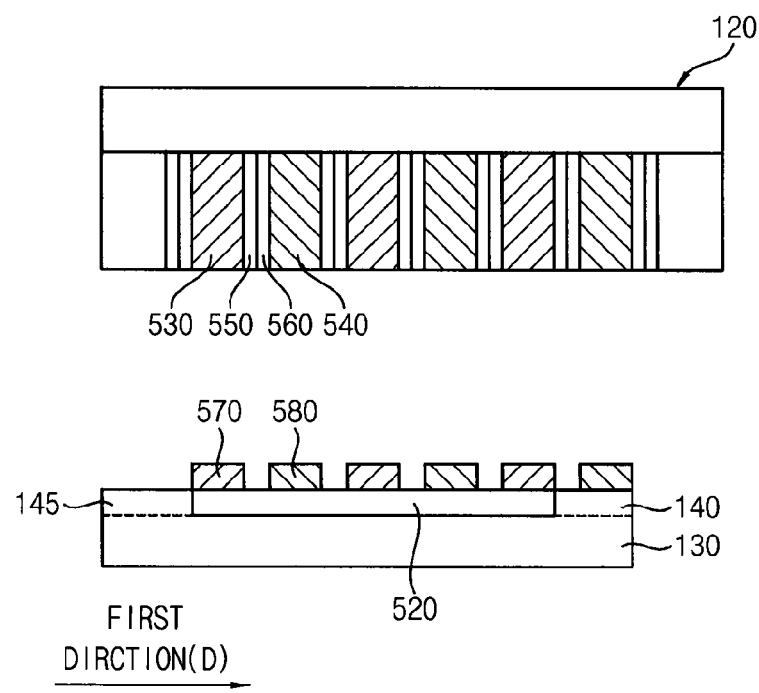
FIG. 5A and FIG. 5B are diagrams illustrating an exemplary embodiment of the method of depositing an atomic layer of FIG. 2.
Figure 5B:
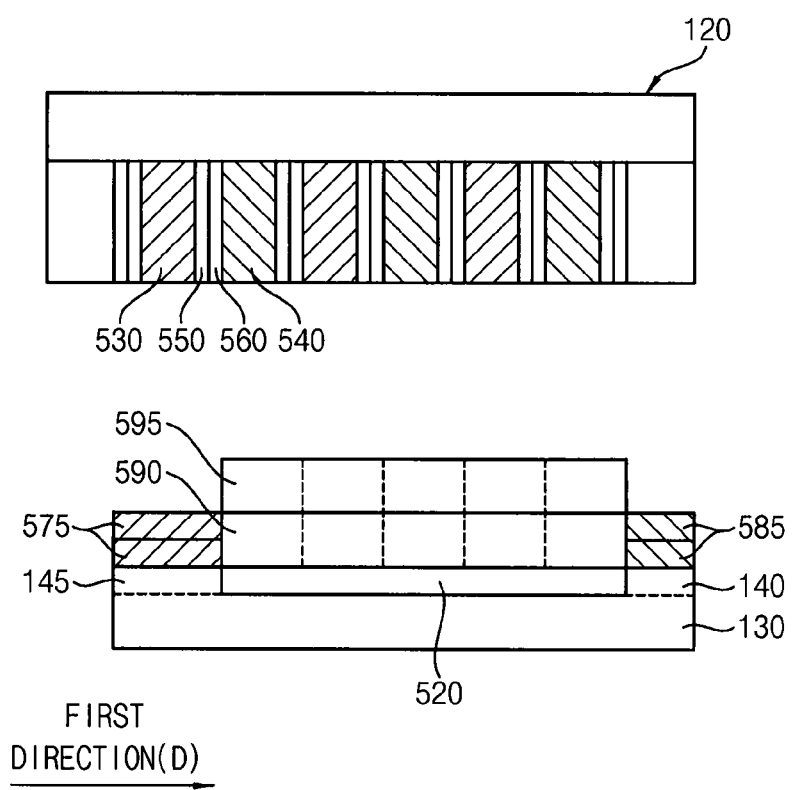

FIG. 5A and FIG. 5B are diagrams illustrating an exemplary embodiment of the method of depositing an atomic layer of FIG. 2.

Referring to FIG. 5A and FIG. 5B, a susceptor unit 130 having buffer plates 140 and 145 may move by the distance corresponding to the width of the source gas spray nozzle or the width of the reactant gas spray nozzle in the first direction (D) and the second direction, so that the first monolayer 590 and the second monolayer 595 may be formed on the substrate 520. Herein, the reactant gas region 485 and the source gas region 475 may be formed on each buffer plates 140 and 145, respectively. The method of forming the first monolayer 590 and the second monolayer 595 are described above.

In exemplary embodiments, a purge gas spray nozzle 550 arranged between the is source gas spray nozzle 530 and the reactant gas spray nozzle 540 may spray the purge gas onto the substrate 520. The purge gas may remove remaining source gas and reactant gas. In exemplary embodiments, two purge gas spray nozzles may be arranged at both sides of the gas spray unit 120, respectively. In exemplary embodiments, the purge gas spray nozzles may be arranged at both sides of the gas spray unit 120, and between the source gas spray nozzle 530 and the reactant gas spray nozzle 540. Further, in exemplary embodiments, at least one exhaust nozzle 560 may discharge remaining source gas, reactant gas, and purge gas out. In exemplary embodiments, the exhaust nozzle 560 may be arranged between the source gas spray nozzle 530 and the reactant gas spray nozzle 540.

The second monolayer 595 may be formed by repeating the process of forming the first monolayer 590. Reproducibility of the atomic layer deposition process may be improved by including the purging process and the exhausting process in forming monolayer process.

The method of depositing the monolayer and the atomic layer deposition apparatus may move by the distance corresponding to the width of the source gas spray nozzle (A) or the width of the reactant gas spray nozzle, thus the length of each buffer plate 140 and 145 may be minimized to the width of the source gas spray nozzle (A) or the width of the reactant gas spray nozzle. Thus, a size of the atomic layer deposition apparatus 100 may be reduced because the moving distance of the susceptor unit 130 may be less than ⅓ of that of the conventional space. Despite increase in the size of the substrate 520, minimizing the size of the atomic layer deposition apparatus may shorten the tact time in thin film deposition process, reduced production cost from reduced usage of the source gas, the reactant gas, and the purge gas, improved stability of the apparatus from decreased moving distance of the susceptor unit, and is improved reproducibility of the process and uniformity of the thin film formed on the substrate.

The present embodiments may be applied to any semiconductor device manufacturing apparatus, to any thin film deposition apparatus depositing to substrate, and to any substrate of semiconductors.

The foregoing is illustrative of exemplary embodiments, and is not to be construed as limiting thereof. Although a few exemplary embodiments have been described, those skilled in the art will readily appreciate that many modifications are possible in the exemplary embodiments without materially departing from the novel teachings and advantages of exemplary embodiments. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. A method of depositing a layer, the method comprising:
spraying a source gas and a reactant gas onto a substrate disposed on a susceptor unit using at least one source gas spray nozzle and at least one reactant gas nozzle to form a first source gas region and a first reactant gas region on the substrate, respectively, the at least one source gas spray nozzle and the at least one reactant gas spray nozzle being alternately arranged in a gas spray unit;
moving the susceptor unit by a distance corresponding to a width of the at least one source gas spray nozzle or a width of the at least one reactant gas spray nozzle in a first direction so that the at least one reactant gas spray nozzle is disposed over the first source gas region and the at least one source gas spray nozzle is disposed over the first reactant gas region; and
spraying the source gas and the reactant gas onto the first reactant gas region and the first source gas region using the at least one source gas spray nozzle and the at least one reactant gas nozzle, respectively, to form a first monolayer.

2. The method of claim 1, further comprising:
moving the susceptor unit by the distance corresponding to the width of the at least one source gas spray nozzle or the width of the at least one reactant gas spray nozzle in a second direction, which is opposite to the first direction;
spraying the source gas and the reactant gas onto the first monolayer using the at least one source gas spray nozzle and the at least one reactant gas spray nozzle to form a second source gas region and a second reactant gas region, respectively, on the first monolayer;
moving the susceptor unit by the distance corresponding to the width of the at least one source gas spray nozzle or the width of the at least one reactant gas spray nozzle in the first direction so that the at least one reactant gas spray nozzle is disposed over the second source gas region and the at least one source gas spray nozzle is disposed over the second reactant gas region; and
spraying the source gas and the reactant gas onto the second reactant gas region and the second source gas region using the at least one source gas spray nozzle and the at least one reactant gas spray nozzle, respectively, to form a second monolayer on the first monolayer.

3. The method of claim 2, further comprising:
forming at least one monolayer on the second monolayer by at least one reciprocating motion of the susceptor unit.

4. The method of claim 1, wherein buffer plates are arranged on the susceptor unit at both sides of the substrate, and a length of each buffer plate corresponds to the width of the at least one source gas spray nozzle or the width of the at least one reactant gas spray nozzle.

5. The method of claim 1, further comprising:
removing remaining source gas on the substrate by spraying a purge gas using at least one purge gas spray nozzle; and
removing remaining reactant gas on the substrate by spraying the purge pas using the at least one purge gas spray nozzle.

6. The method of claim 5, wherein the at least one purge gas spray nozzle is arranged between the at least one source gas spray nozzle and the at least one reactant gas spray nozzle.

7. The method of claim 1, further comprising:
removing remaining source gas on the substrate using at least one exhaust nozzle; and
removing remaining reactant gas on the substrate using the at least one exhaust nozzle.

8. The method of claim 7, wherein the at least one exhaust nozzle is arranged between the at least one source gas spray nozzle and the at least one reactant gas spray nozzle.

9. A method of depositing a layer, the method comprising:
spraying a source gas onto a substrate disposed on a susceptor unit using at least one source gas spray nozzle to form a first source gas region on the substrate from a gas spray unit, the at least one source gas spray nozzle and at least one reactant gas spray nozzle being alternately arranged in the gas spray unit;
moving the susceptor unit by a distance corresponding to a width of the at least one source gas spray nozzle or a width of the at least one reactant gas spray nozzle in a first direction so that the at least one reactant gas spray nozzle is disposed over the first source gas region and the at least one source gas spray nozzle is disposed over a region where the substrate is exposed;
spraying the source gas onto the region where the substrate is exposed, using the at least one source gas spray nozzle to form a second source gas region on the substrate;
spraying a reactant gas onto the first source gas region to form first monolayer region;
moving the susceptor unit by the distance corresponding to the width of the at least one source gas spray nozzle or the width of the at least one reactant gas spray nozzle in a second direction, which is opposite to the first direction, so that the at least one reactant gas spray nozzle is disposed over the second source gas region and the at least one source gas spray nozzle is disposed over the first monolayer region; and
spraying the reactant gas onto the second source gas region using the reactant gas nozzle to form a first monolayer.

* * * * *